United States Patent
Kirby et al.

(10) Patent No.: US 10,158,062 B2
(45) Date of Patent: Dec. 18, 2018

(54) SUPERCONDUCTOR DEVICE INTERCONNECT

(71) Applicant: NORTHROP GRUMMAN SYSTEMS CORPORATION, Fairview Park, VA (US)

(72) Inventors: Christopher F. Kirby, Gambrills, MD (US); Michael Rennie, Ashland, VA (US); Aurelius L. Graninger, Sykesville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/971,542

(22) Filed: May 4, 2018

(65) Prior Publication Data

US 2018/0301614 A1 Oct. 18, 2018

Related U.S. Application Data

(62) Division of application No. 15/244,827, filed on Aug. 23, 2016, now Pat. No. 10,003,005.

(51) Int. Cl.
*H01L 39/02* (2006.01)
*H01L 39/22* (2006.01)
*H01L 39/24* (2006.01)

(52) U.S. Cl.
CPC ........ *H01L 39/2493* (2013.01); *H01L 39/025* (2013.01); *H01L 39/223* (2013.01)

(58) Field of Classification Search
CPC .. H01L 39/2493; H01L 39/025; H01L 39/223
See application file for complete search history.

(56) References Cited

U.S. PATENT DOCUMENTS

| 5,055,158 A | 10/1991 | Gallagher et al. |
| 7,060,508 B2 * | 6/2006 | Kerber ................ H01L 39/2493 438/2 |

(Continued)

FOREIGN PATENT DOCUMENTS

| JP | S6281075 A | 4/1987 |
| JP | S63205975 A | 8/1988 |

(Continued)

OTHER PUBLICATIONS

International Search Report corresponding to International Application No. PCT/US2017/045355, dated Jun. 7, 2018.

*Primary Examiner* — Hoang-Quan Ho
(74) *Attorney, Agent, or Firm* — Tarolli, Sundheim, Covell & Tummino LLP

(57) ABSTRACT

A method is provided of forming a superconductor device interconnect structure. The method includes forming a first high temperature dielectric layer overlying a substrate, forming a base electrode in the first high temperature dielectric layer with the base electrode having a top surface aligned with the top surface of the first high temperature dielectric layer, and depositing a second high temperature dielectric layer over the first high temperature dielectric layer and the base electrode. The method further comprises forming a first contact through the second dielectric layer to a first end of the base electrode, forming a Josephson junction (JJ) overlying and in contact with the first contact, and forming a second contact through the second dielectric layer to a second end of the base electrode.

17 Claims, 9 Drawing Sheets

(56) References Cited

U.S. PATENT DOCUMENTS

| | | | |
|---|---|---|---|
| 9,633,314 | B2 | 4/2017 | Kwon |
| 9,768,371 | B2 * | 9/2017 | Ladizinsky ............ B82Y 10/00 |
| 9,780,285 | B1 | 10/2017 | Kirby et al. |
| 2011/0241765 | A1 | 10/2011 | Pesetski et al. |
| 2017/0162813 | A1 | 6/2017 | Lee et al. |

FOREIGN PATENT DOCUMENTS

| | | |
|---|---|---|
| JP | H111274298 A | 10/1999 |
| WO | 2018075116 A2 | 4/2018 |

* cited by examiner

SUPERCONDUCTOR DEVICE INTERCONNECT

RELATED APPLICATIONS

The present application is a divisional application which claims priority from U.S. patent application Ser. No. 15/244,827, filed 23 Aug. 2016.

TECHNICAL FIELD

The present invention relates generally to superconductors, and more particularly to a superconductor device interconnect.

BACKGROUND

Superconducting circuits are one of the leading technologies proposed for quantum computing and cryptography applications that are expected to provide significant enhancements to national security applications where communication signal integrity or computing power are needed. They are operated at temperatures <100 kelvin. Efforts on fabrication of superconducting devices have mostly been confined to university or government research labs, with little published on the mass producing of superconducting devices. Therefore, many of the methods used to fabricate superconducting devices in these laboratories utilize processes or equipment incapable of rapid, consistent fabrication. Furthermore, the need for low temperature processing currently presents one of the more significant barriers to mass production of superconducting devices.

One of the common devices employed in superconducting circuits is a Josephson junction (JJ), which can be embedded in a dielectric interconnect structure. Typically, Josephson junctions (JJs) interconnect structures are formed employing low temperature materials (e.g., formed at less than or equal to 180° C.) since the utilization of higher temperature materials can result in damage to the structure of the JJ, and thus cause deterioration of the normal operation of the JJ. The utilization of low temperature materials in the superconducting device interconnects results in more losses than the utilization of high temperature materials. Furthermore, the use of legacy processing techniques to form a JJ result in large topography problems and therefore problems with yield and reliability of the JJ. Both of these reasons lead to a minimum size of JJ of the order of 1 um diameter which limits the density and functionality of an integrated chip.

An attempt has been made to employ low loss high temperature dielectrics (e.g., formed at temperatures greater than 180° C.) in forming circuits with JJs. One example method uses a non-planarized deposition of sputtered quartz to form the high temperature dielectric. However, this process is not scalable to the desired 0.25 um technologies, and the lack of planarization limits these devices to 4 levels of interconnect.

SUMMARY

In one example, a method is providing of forming a superconductor device interconnect structure. The method comprises forming a first high temperature dielectric layer overlying a substrate, forming a base electrode in the first high temperature dielectric layer with the base electrode having a top surface aligned with the top surface of the first high temperature dielectric layer, and depositing a second high temperature dielectric layer over the first high temperature dielectric layer and the base electrode. The method further comprises forming a first contact from a top surface of the second high temperature dielectric layer to a first end of the base electrode, forming a Josephson junction (JJ) overlying and in contact with a top surface of the first contact, and forming a second contact from a top surface of the second dielectric layer to a second end of the base electrode.

In another example, a method of forming a superconductor device interconnect structure is provided. The method comprises forming a first high temperature dielectric layer overlying a substrate, forming a base electrode in the first high temperature dielectric layer with the base electrode having a top surface aligned with the top surface of the first high temperature dielectric layer, depositing a second high temperature dielectric layer over the JJ, and the first high temperature dielectric layer, and forming a first contact from a top surface of the second dielectric layer to a first end of the base electrode. The method further comprises polishing the top surface of the first contact, depositing a first aluminum layer over the first contact and the second dielectric layer, oxidizing the first aluminum layer to form an aluminum oxide layer on the top surface of the first aluminum layer, and forming a second aluminum layer over the aluminum oxide layer. The method further comprises etching the second aluminum layer to encapsulate the aluminum oxide layer with the second aluminum layer to form a JJ and remove the remaining portions of the second aluminum layer, and forming a second contact from a top surface of the second high temperature dielectric layer to a second end of the base electrode, a first conductive line overlying the first contact and a second conductive line overlying the second contact, wherein the first and second conductive lines overly a top surface of the second dielectric layer.

In yet another example, a superconductor device interconnect structure is provided. The structure comprises a first high temperature dielectric layer overlying a substrate, a base electrode disposed in the first high temperature dielectric layer with the base electrode having a top surface aligned with the top surface of the first high temperature dielectric layer, a second high temperature dielectric layer disposed over the first high temperature dielectric layer and the base electrode, and a first contact that extends from a top surface of the second high temperature dielectric layer to a first end of the base electrode. The structure further comprises a JJ overlying the first contact, a second contact that extends from a top surface of the second high temperature dielectric layer to a second end of the base electrode, a first conductive line overlying the first contact, and a second conductive line overlying the second contact.

DETAILED DESCRIPTION

The present invention is directed to a high temperature low loss dielectric superconductor device (e.g., Josephson junction (JJ)) interconnect structure and a method for forming the same. In one example, an aluminum (AL) based superconducting JJ (e.g., Al/aluminum-oxide(AlOx)/Al) is incorporated into a dual damascene process for scaling into a high density multilevel interconnect submicron technology. The interconnect metal used for this integration can be, for example, niobium (Nb). The active JJ is required to be surrounded by high temperature dielectrics to obtain performance targets at RF frequencies. The method incorporates a scalable JJ process into a planarized superconducting interconnect scheme with a high temperature dielectric.

A high temperature dielectric is formed of a dielectric material that is formed at temperatures greater than 180° C. Temperatures at greater than 180° C. can cause damage to the structure of the JJ, while a low temperature dielectric is formed at temperatures that are less than 180° C. which do not typically cause damage to the structure of the JJ. High temperature dielectrics provide superconducting devices that have less signal loss than devices embedded in low temperature dielectrics and allow for devices within the dielectric to operate with improved performance relative to devices embedded in low temperature dielectric.

The invention also resolves the problem of making high density JJs of 0.5 um and below into a multilevel process flow to enable high levels of interconnects. This present formation of JJs utilizes a scaled process technology, and specifically utilizes the chemical mechanical polish (CMP) of Al followed by oxidation of the aluminum to form the thin tunnel barrier. There is no documented evidence of a JJ formed on a polished surface to date when fabricating high density functional Al/AlOx/Al JJ devices (0.35 um and larger) and circuits with niobium based interconnect of 0.25 um dimensions. The aluminum based JJ has significantly different performance characteristics compared to the common niobium based JJs.

Figure 1:
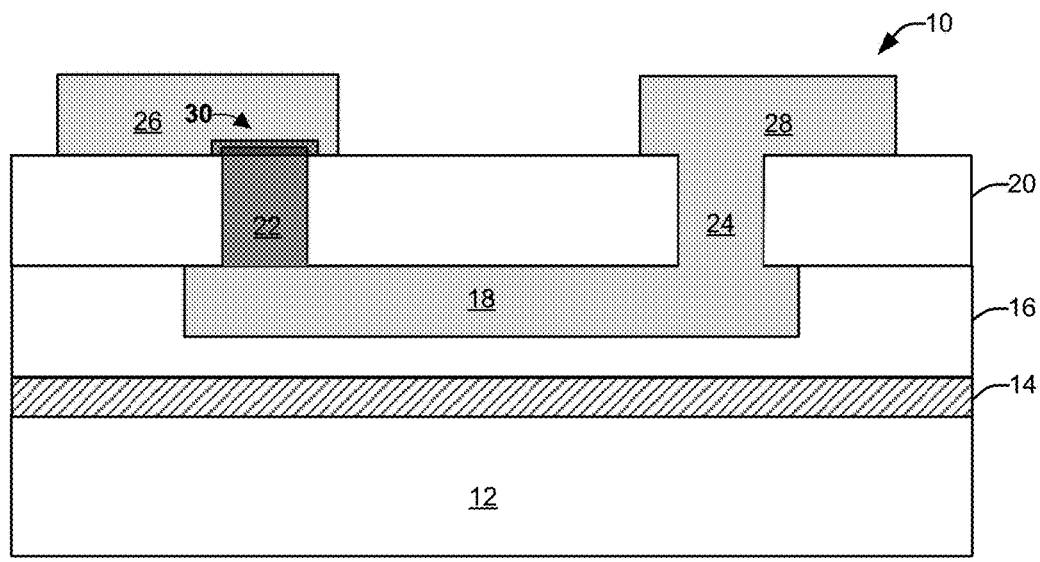
FIG. 1 illustrates cross-sectional view of a superconducting device interconnect structure.

FIG. 1 illustrates cross-sectional view of a superconducting device JJ interconnect structure 10. The superconducting device structure 10 includes an active layer 14 overlying a substrate 12. The substrate 12 can be formed of silicon, glass or other substrate material. The active layer 14 can be a ground layer or a device layer. A first high temperature dielectric layer 16 overlies the active layer 14, and a second high temperature dielectric layer 20 overlies the first high temperature dielectric layer 16. Both the first and the second high temperature dielectric layers are formed of a dielectric material that can be employed in high temperatures (e.g., greater than or equal to 180 degrees Celsius) typically utilized in the formation of semiconductors.

A base electrode 18 is embedded in the first high temperature dielectric layer 16. A JJ 3 is overlays the second high temperature dielectric layer 20. The JJ 3 is formed from an aluminum layer with an oxidized top surface and capped with an aluminum layer that encapsulates the oxidized top surface. A first conductive contact 22 formed from, for example aluminum, extends from the JJ 2 to a first end of the base electrode 18 through the second high temperature dielectric layer 20. Importantly, the first conductive contact 22 defines the width of the JJ 3. In this manner, the JJ can be made with a width as small as the ability of the technology used to make the first conductive contact 22, which is much smaller for the high temperature dielectric material as opposed to a low temperature dielectric material.

A second conductive contact 24 formed from, for example, niobium, extends from the top surface of the second high temperature dielectric layer 20 to a second end of the base electrode 18. A first side of the JJ 30 is connected to a first conductive line 26, which is considered the top electrode of the JJ 30. A second conductive line 28 is considered the counter electrode and is coupled to the base electrode 18 by the second conductive contact 24. The base electrode 18 is coupled to the second side of the JJ 30 and the counter electrode. The conductive lines 26 and 28 are formed of a superconducting material, such as niobium.

Turning now to FIGS. 2-10, fabrication is discussed in connection with formation of interconnects in the superconducting device of FIG. 1. It is to be appreciated that the present example is discussed with respect to a process flow that starts with the formation of either a single or dual damascene layer of superconducting metal in an insulating dielectric. If the JJ is formed first then it would be a single damascene as depicted below or dual damascene if inserted within a multi-level interconnect. The present example will be illustrated with respect to a single damascene trench etched into a dielectric thin film to form a bottom electrode followed by a dual damascene process to form a top electrode.

Figure 2:
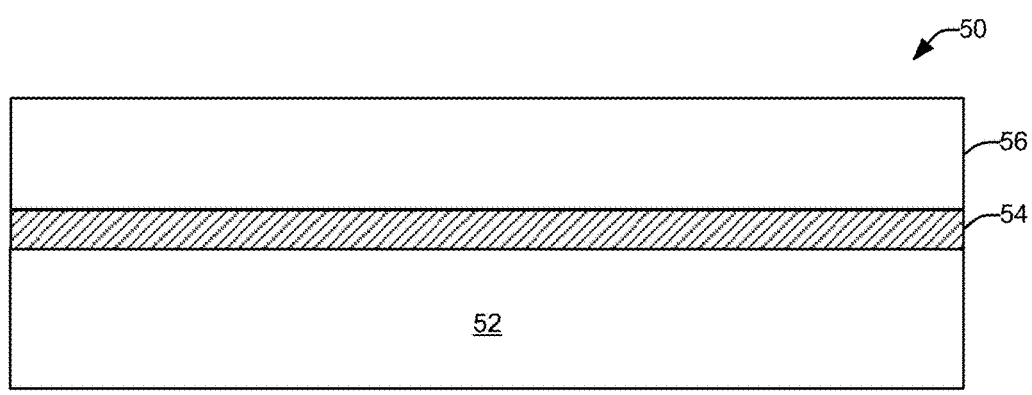
FIG. 2 illustrates a schematic cross-sectional view of an example of a superconductor structure in its early stages of fabrication.

FIG. 2 illustrates a superconductor structure 50 in its early stages of fabrication. The superconductor structure 50 includes an active layer 54, such as a ground layer or device layer, that overlays an underlying substrate 52. The underlying substrate 52 can be, for example, a silicon or glass wafer that provides mechanical support for the active layer 54 and subsequent overlying layers. A first high temperature dielectric layer 56 is formed over the active layer 54. Any suitable technique for forming the first high temperature dielectric layer 56 may be employed such as Low Pressure Chemical Vapor Deposition (LPCVD), Plasma Enhanced Chemical Vapor Deposition (PECVD), High Density Chemical Plasma Vapor Deposition (HDPCVD), sputtering or spin on techniques to a thickness suitable for providing an interconnect layer. Alternatively, the first high temperature dielectric layer 56 can be formed directly on the substrate 50.

Figure 3:
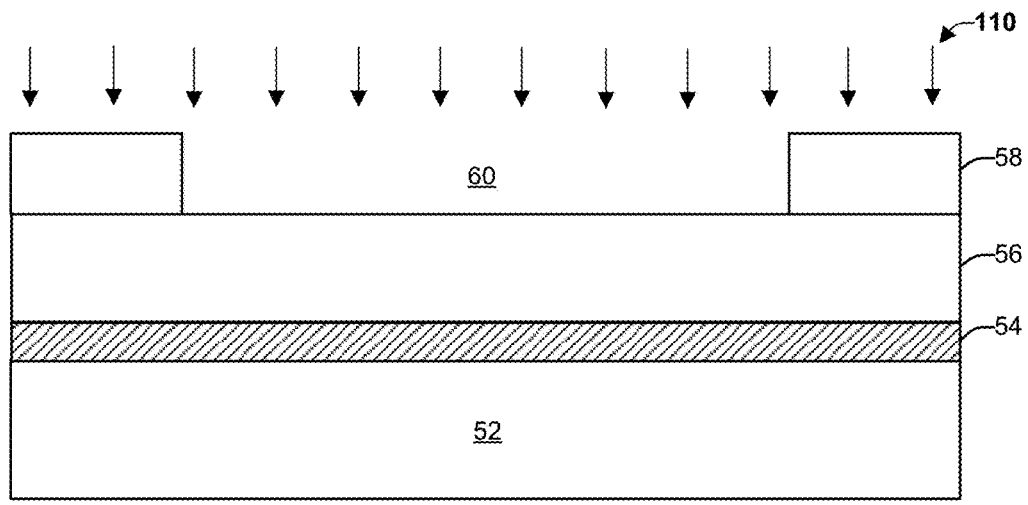
FIG. 3 illustrates a schematic cross-sectional view of the structure of FIG. 2 after a photoresist material layer has been deposited and patterned, and while undergoing an etch process.
Figure 4:
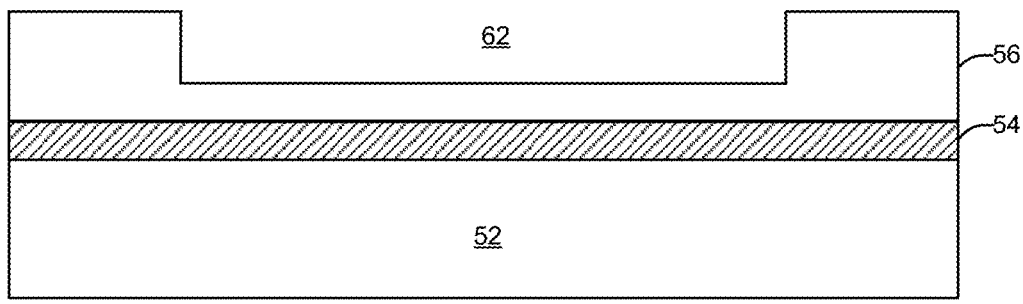
FIG. 4 illustrates a schematic cross-sectional view of the structure of FIG. 3 after the etch process and after the photoresist material layer has been stripped.

Next, as illustrated in FIG. 3, a photoresist material layer 58 is applied to cover the structure and is then patterned and developed to expose a trench opening 60 in the photoresist material layer 58 in accordance with a trench pattern. The photoresist material layer 58 can have a thickness that varies in correspondence with the wavelength of radiation used to pattern the photoresist material layer 58. The photoresist material layer 58 may be formed over the first high temperature dielectric layer 56 via spin-coating or spin casting deposition techniques, selectively irradiated (e.g., via deep ultraviolet (DUV) irradiation) and developed to form the trench opening 60.

FIG. 3 also illustrates performing of an etch 110 (e.g., anisotropic reactive ion etching (RIE)) on the first high temperature dielectric layer 56 to form an extended trench openings 62 (FIG. 4) in the first high temperature dielectric layer 56 based on the trench pattern in the photoresist material layer 58. The etch step 110 can be a dry etch and employ an etchant which selectively etches the underlying first high temperature dielectric layer 56 at a faster rate than the underlying active layer 54 and the overlying photoresist material layer 58. For example, the first high temperature dielectric layer 56 may be anisotropically etched with a plasma gas(es), herein carbon tetrafloride ($CF_4$) containing fluorine ions, in a commercially available etcher, such as a parallel plate RIE apparatus or, alternatively, an electron cyclotron resonance (ECR) plasma reactor to replicate the mask pattern of the photoresist material layer 58 to thereby create the extended trench opening 62. The photoresist material layer 58 is thereafter stripped (e.g., ashing in an $O_2$ plasma) so as to result in the structure shown in FIG. 4.

Figure 5:
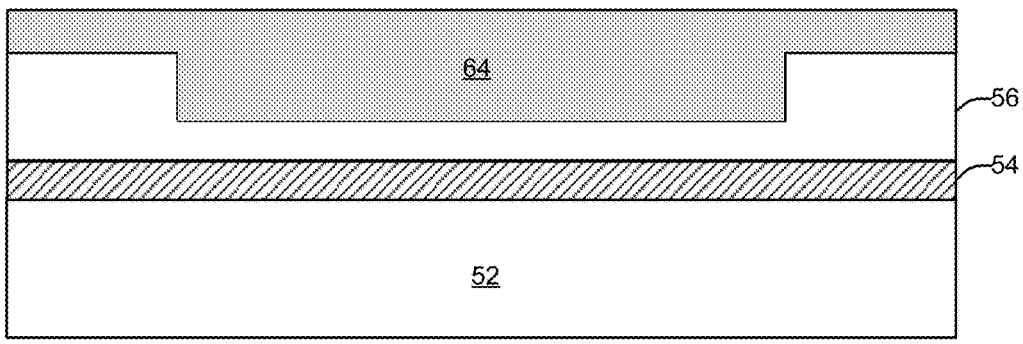
FIG. 5 illustrates a schematic cross-sectional view of the structure of FIG. 4 after a contact material fill.

Next, the structure undergoes a contact material fill to deposit a superconducting material 64, such as niobium or tantalum (Ta) or some other superconducting material, into the trench 62 to form the resultant structure of FIG. 5. The contact material fill can be deposited employing a standard contact material deposition. Following deposition of the contact material fill, the superconducting material 64 is polished via chemical mechanical polishing (CMP) down to the surface level of the first high temperature dielectric layer 56 to form the base electrode 66 and provide the resultant structure of FIG. 6.

Figure 6:
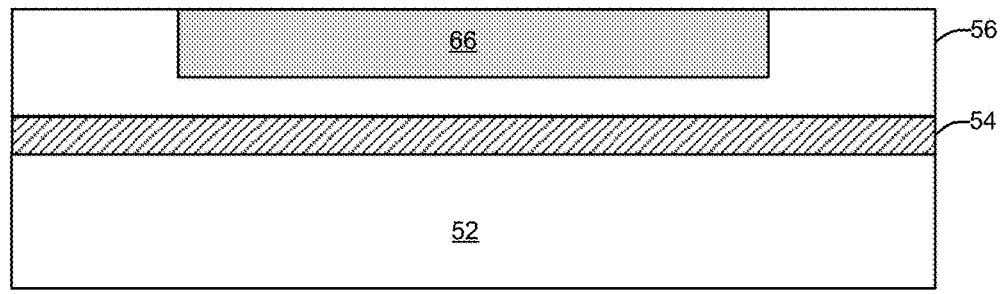
FIG. 6 illustrates a schematic cross-sectional view of the structure of FIG. 5 after undergoing a chemical mechanical polish.
Figure 7:
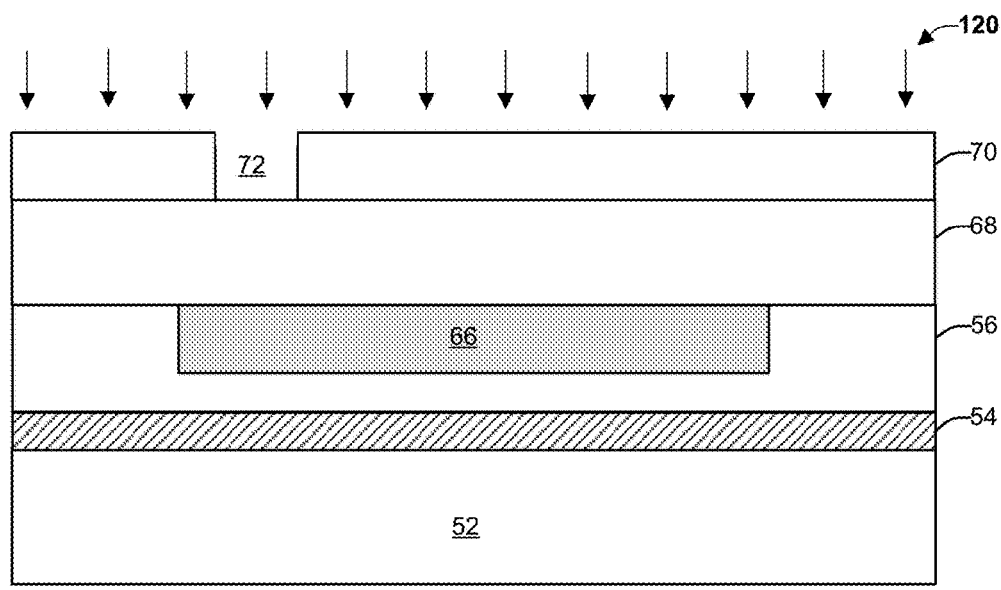
FIG. 7 illustrates a schematic cross-sectional view of the structure of FIG. 6 after deposition of a second high temperature dielectric, a photoresist material layer deposition and patterning, and while undergoing an etch process to form a first via.

Next, as represented in FIG. 7, a second high temperature dielectric layer 68 is formed over the structure of FIG. 6. The second high temperature dielectric layer 68 can be formed in the same manner and techniques as the first high temperature dielectric layer 56. As shown in FIG. 7, a photoresist material layer 70 is applied to cover the structure and is then patterned (e.g., DUV imaged) and developed to expose an open region 72 in the photoresist material layer 70 in accordance with a via pattern. FIG. 7 also illustrates performing of an etch 120 on the second high temperature dielectric layer 68 to form an extended via opening 74 (FIG. 8) in the second high temperature dielectric layer 68 based on the via pattern in the photoresist material layer 70. The first extended open region 72 or via extends to the base electrode 66. The photoresist material layer 70 is thereafter stripped (e.g., ashing in an $O_2$ plasma) so as to result in the structure shown in FIG. 8.

Figure 8:
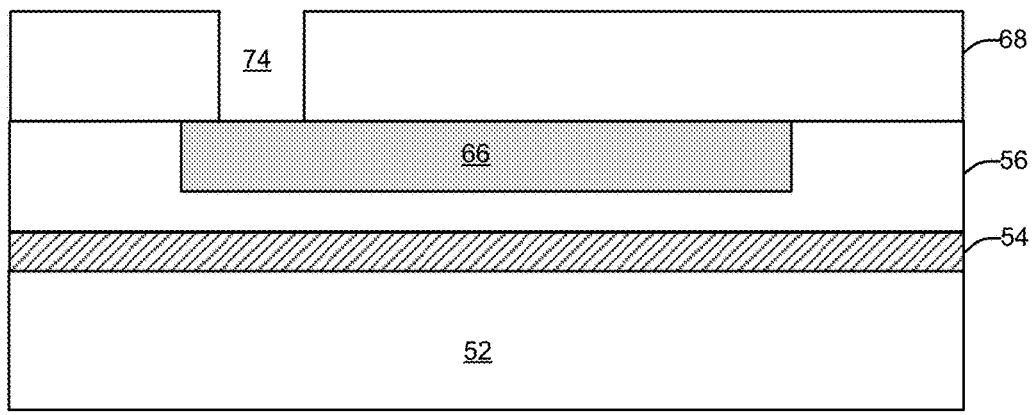
FIG. 8 illustrates a schematic cross-sectional view of the structure of FIG. 7 after the etch process and after the photoresist material layer has been stripped.
Figure 9:
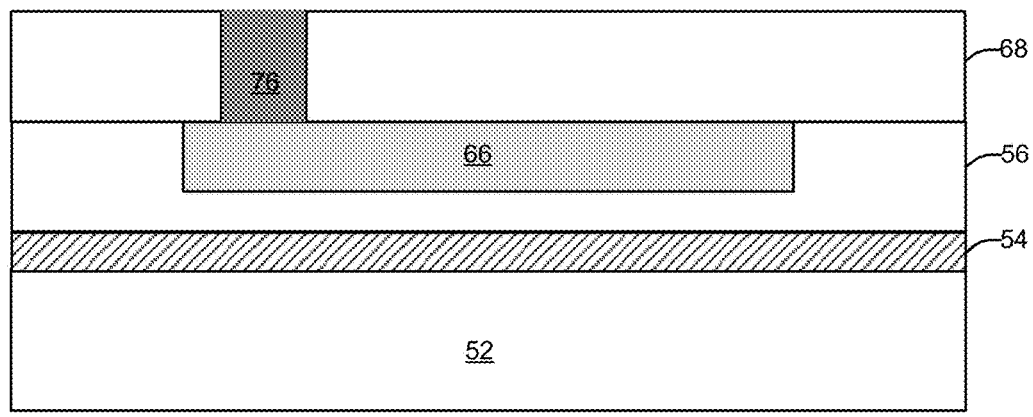
FIG. 9 illustrates a schematic cross-sectional view of the structure of FIG. 8 after a contact material fill to form a first contact and after a chemical mechanical polish.
Figure 10:
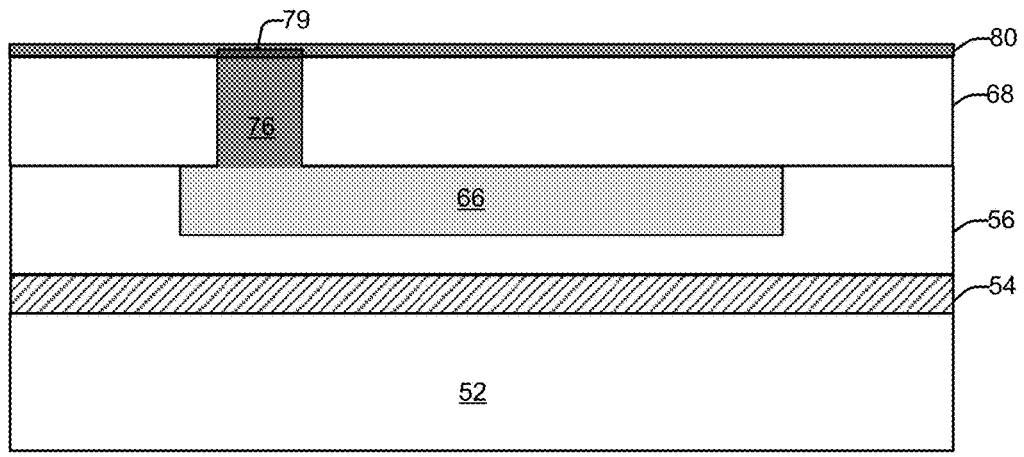
FIG. 10 illustrates a schematic cross-sectional view of the structure of FIG. 9 after undergoing an oxidation to form an layer on a top surface of the first contact and after undergoing a deoposition process to form a cap layer.

Next, a sputter pre-clean is performed to remove any oxidation on the contact material of the base electrode of FIG. 8. Furthermore, the structure of FIG. 8 undergoes a sputter deposition of, for example, aluminum to fill the first extended open region 72 or via that extends to the base electrode 66 to form a conductive contact 76. The top surface of the first conductive contact 76 is then polished using CMP to form a smooth surface for forming of the JJ on top of the first conductive contact 76 to provide the resultant structure of FIG. 9. The roughness of the polished surface is very important to ensure good JJ characteristics. Additionally, the width of the JJ is defined based on the width of the first extended open region 72 or via, and ultimately the width of the conductive contact 76.

Figure 11:
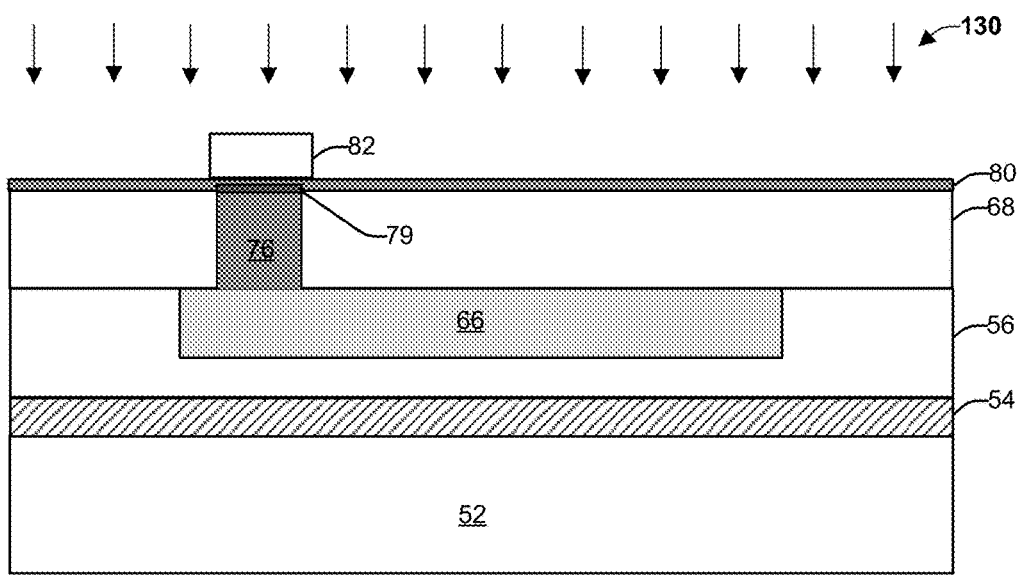
FIG. 11 illustrates a schematic cross-sectional view of the structure of FIG. 10 after a photoresist material layer has been deposited and patterned, and while undergoing an etch process.
Figure 12:
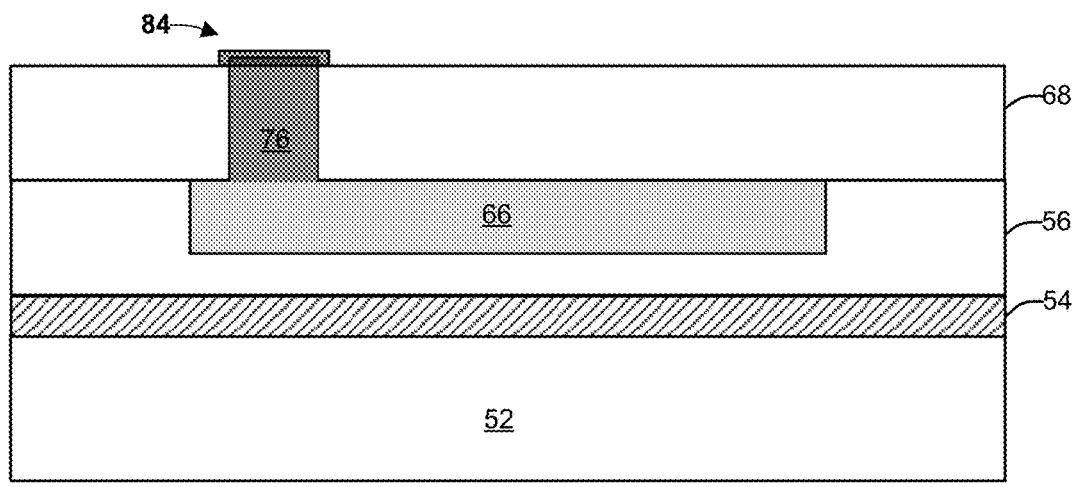
FIG. 12 illustrates a schematic cross-sectional view of the structure of FIG. 11 after the etch process and after the photoresist material layer has been stripped.

Next, the top surface of the first conductive contact 76 is oxidized to form an oxidized top surface 79 and capped with an aluminum layer 80 to form a JJ 84 (FIG. 12). The thin oxidized aluminum 79 forms the tunnel barrier and the aluminum 76 sand 80 on both sides sets the gap voltage of the JJ 84. As illustrated in FIG. 11, a photoresist material layer 82 is applied to cover a portion of the structure that defines the JJ and is then patterned and developed to remove the cap layer 80 everywhere except where the JJ is going to be formed. The photoresist material layer 82 overlaps the thin oxidized aluminum at both ends.

FIG. 11 illustrates performing of an etch 130 (e.g., anisotropic reactive ion etching (RIE)) on the cap layer 80 to form the JJ 84 (FIG. 12) to define the final JJ size. The remaining cap layer after the etch 130 encapsulates the thin oxidized aluminum 79. The etch step 130 can be a dry etch that employs an etchant which selectively etches the trilayer stack layer at a faster rate than the first conductive contact 76, the second high temperature dielectric layer 68 and the overlying photoresist material layer 82. A chlorine based plasma etch is utilized as the etchant since it will etch superconducting materials, such as niobium, tantalum and aluminum. The aluminum oxide 79 is so thin that etching does not stop due to the presence of argon in the etching chemistry. The plasma etch is desired to not over-etch significantly into the underlying base electrode 66, which is benefited by the good planarity of the underlying structure to thereby create the JJ 84. The photoresist material layer 82 is thereafter stripped (e.g., ashing in an $O_2$ plasma) so as to result in the structure shown in FIG. 12.

Figure 13:
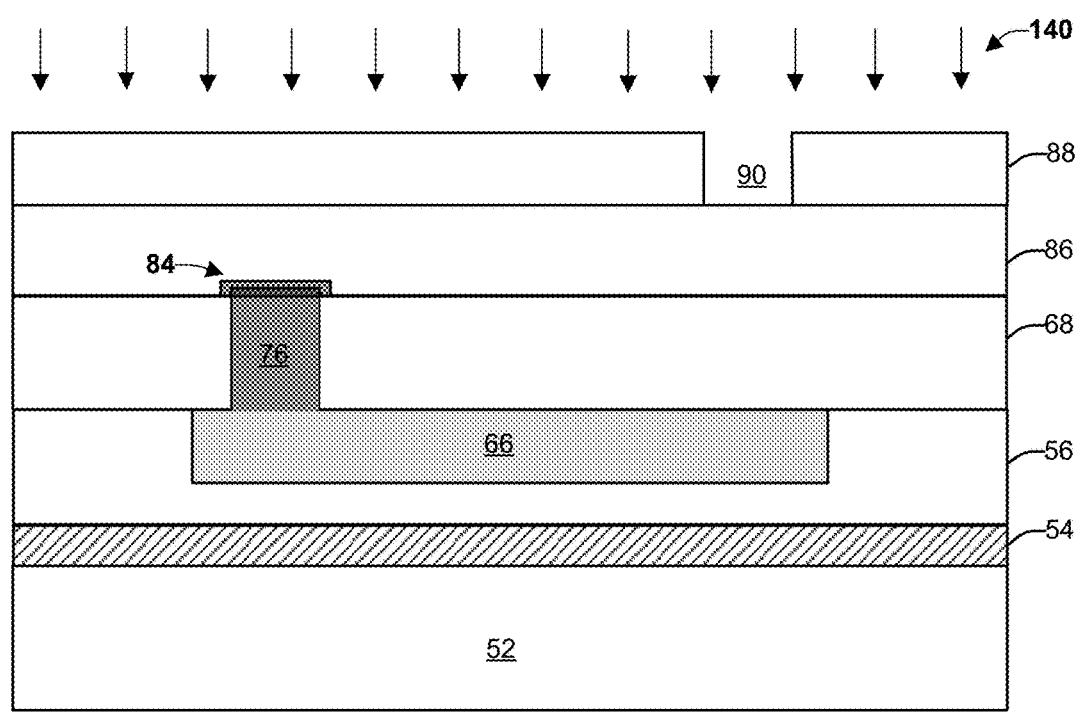
FIG. 13 illustrates a schematic cross-sectional view of the structure of FIG. 12 after deposition of a low temperature dielectric, a photoresist material layer deposition and patterning, and while undergoing an etch process to form a second via.
Figure 14:
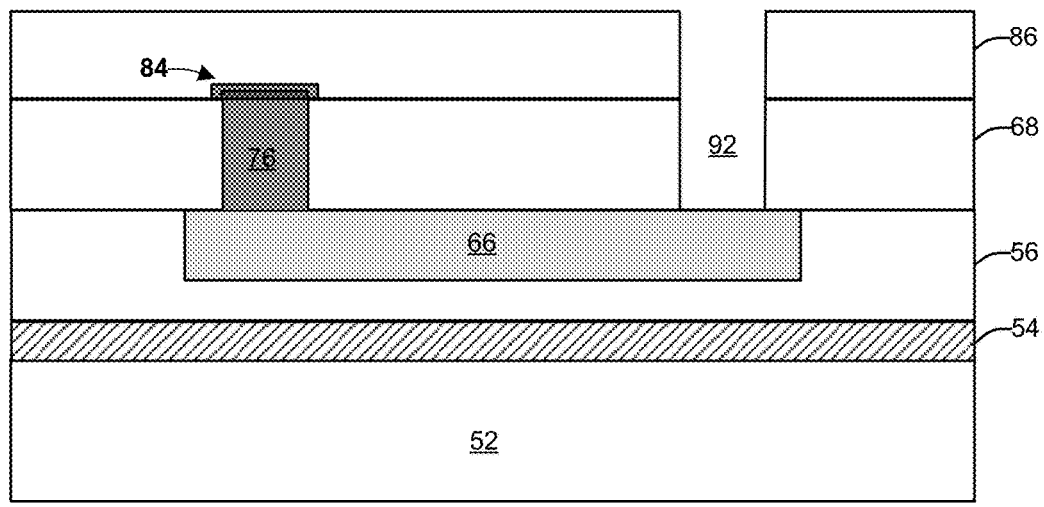
FIG. 14 illustrates a schematic cross-sectional view of the structure of FIG. 13 after the etch process and after the photoresist material layer has been stripped.

Next, as represented in FIG. 13, a low temperature based dielectric layer 86 (e.g., Tetraethyl Orthosilicate (TEOS)) is formed over the structure of FIG. 12 to encapsulate the JJ 84, and enable a plasma etch selectivity of a subsequent etch to the underlying second high temperature dielectric layer 68. The low temperature based dielectric is now used to protect the JJ 84 from subsequent processing due to temperatures and etching processes. A photoresist material layer 88 is applied to cover the structure and is then patterned (e.g., DUV imaged) and developed to expose an open regions 90 in the photoresist material layer 88 in accordance with a via pattern. FIG. 13 also illustrates performing of an etch 140 on the low temperature based dielectric layer 86 to form extended via opening 92 (FIG. 14) in the low temperature based dielectric layer 86 and the second high temperature dielectric layer 68 based on the via pattern in the photoresist material layer 88. The extended via opening 92 extends to a second end of the base electrode 66. The photoresist material layer 88 is thereafter stripped (e.g., ashing in an $O_2$ plasma) to provide the resultant structure of FIG. 14.

Figure 15:
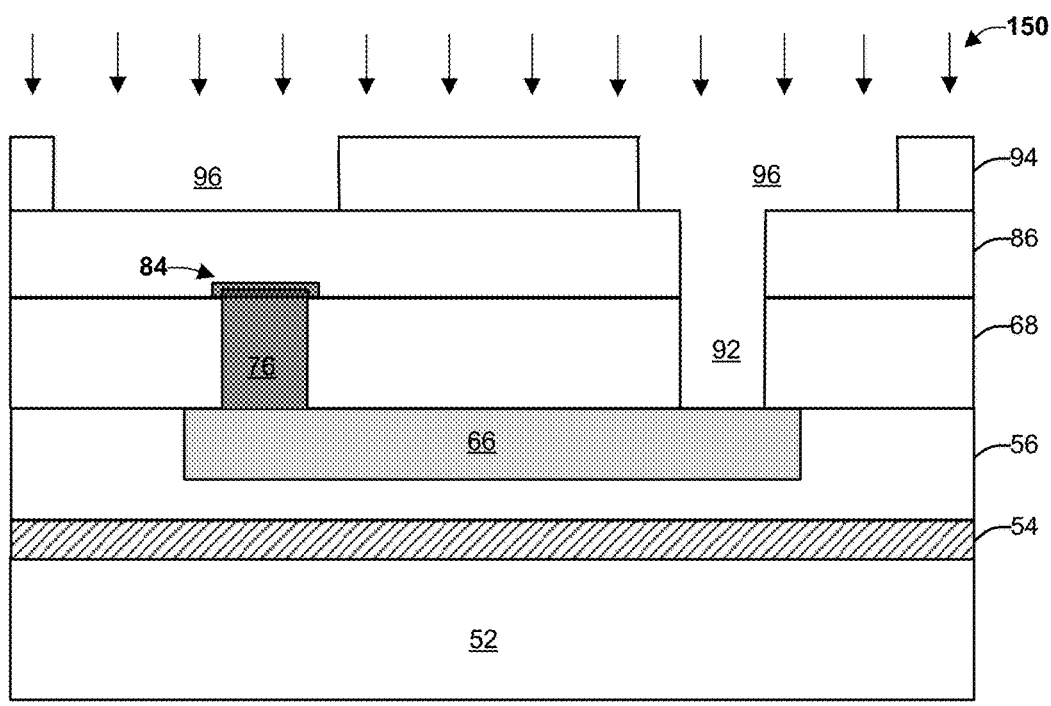
FIG. 15 illustrates a schematic cross-sectional view of the structure of FIG. 14 after a photoresist material layer has been deposited and patterned, and while undergoing an etch process to form trenches.
Figure 16:
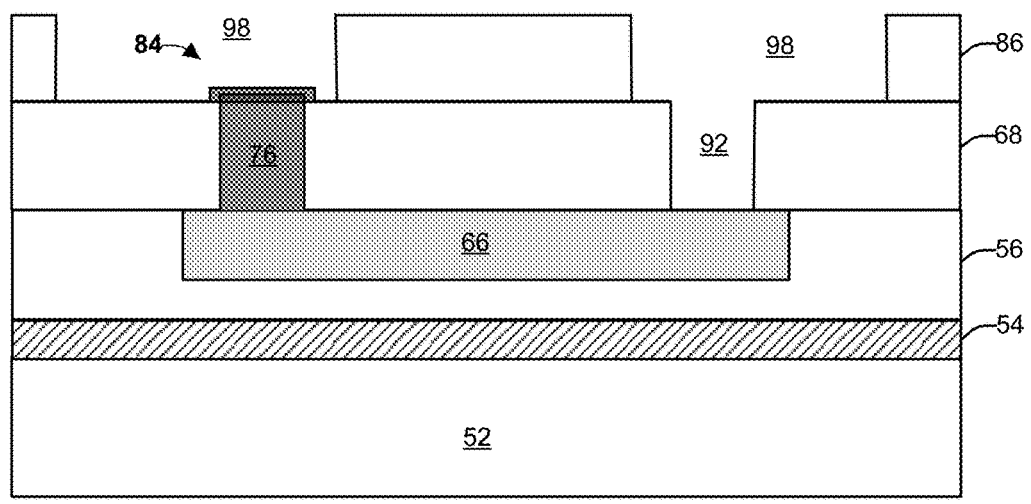
FIG. 16 illustrates a schematic cross-sectional view of the structure of FIG. 15 after the etch process and after the photoresist material layer has been stripped.

Next, as represented in FIG. 15, a photoresist material layer 94 is applied to cover the structure and is then patterned and developed to expose open trench regions 96 in the photoresist material layer 94 in accordance with a trench pattern. FIG. 15 also illustrates performing of an etch 150 (e.g., anisotropic reactive ion etching (RIE)) on the low temperature based dielectric layer 86 to form extended openings 96 (FIG. 16) in the low temperature based dielectric layer 86 based on the trench pattern in the photoresist material layer 94. The etch 150 is a selective etch that is selective to stop on the second high temperature dielectric layer 68. The photoresist material layer 94 is thereafter stripped (e.g., ashing in an $O_2$ plasma) so as to result in the structure shown in FIG. 16.

Figure 17:
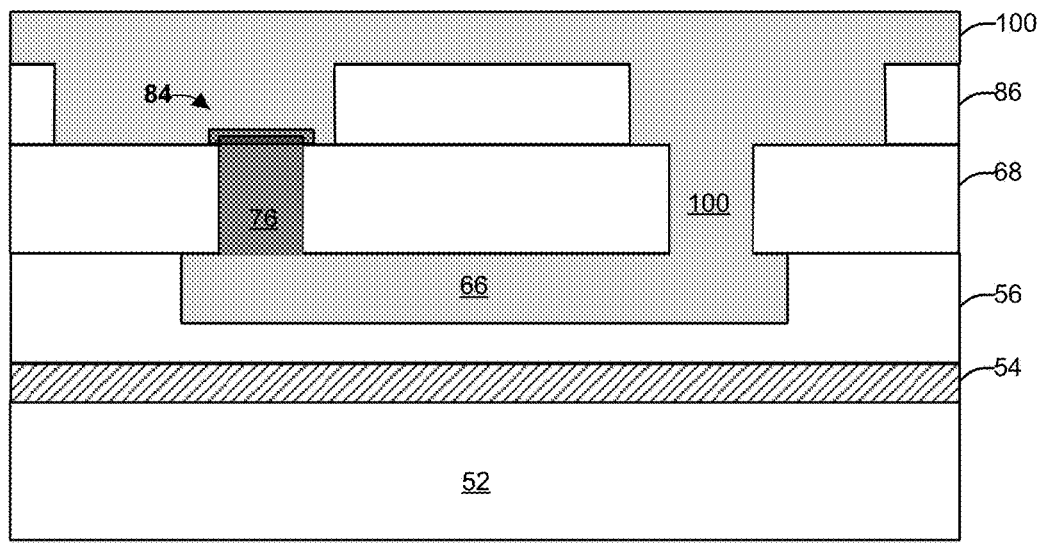
FIG. 17 illustrates a schematic cross-sectional view of the structure of FIG. 16 after a contact material fill.
Figure 18:
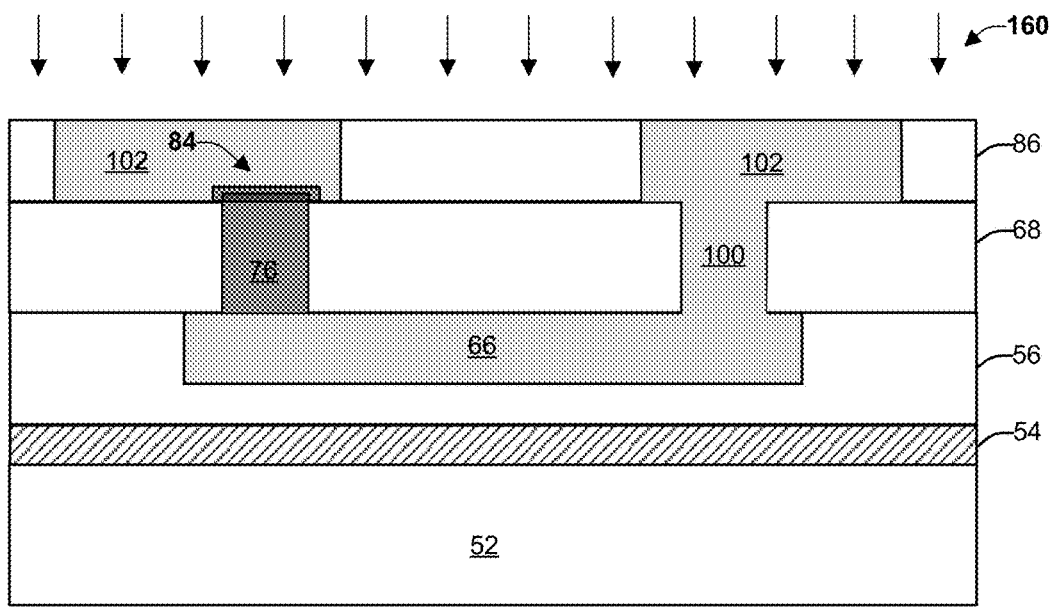
FIG. 18 illustrates a schematic cross-sectional view of the structure of FIG. 17 after undergoing a chemical mechanical polish, and while undergoing an etch process to remove the low temperature dielectric layer.

Next, the structure undergoes a contact material fill to deposit superconducting material 100, such as niobium, into the via 92 and trenches 98 to form contact 100 and conductive lines 102 employing a standard contact material deposition to provide the resultant structure in FIG. 17. Following deposition of the contact material fill, the contact material is polished via chemical mechanical polishing (CMP) down to the surface level of the TEOS based dielectric layer 86 to provide the resultant structure in FIG. 18. Finally an oxide plasma etch 160 is performed on the structure of FIG. 18 to remove the low temperature based dielectric layer 86 to ensure no high loss dielectric is near the JJ 84.

Figure 19:
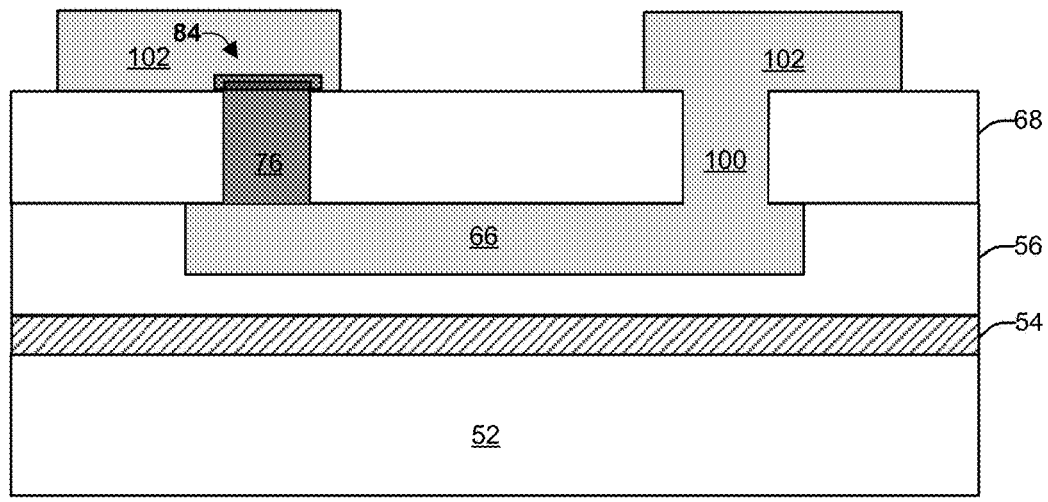
FIG. 19 illustrates a schematic cross-sectional view of the structure of FIG. 18 after undergoing an etch process to remove the low temperature dielectric layer.

A resultant final structure shown in FIG. 19 is provided that includes contacts that extend to the base electrode 66 and the JJ 84 coupled to respective conductive lines 102 to provide a structure similar to the structure illustrated in FIG. 1. The conductive lines 102 form a counter electrode coupled to the base electrode 66 which is coupled to a first end of the JJ 84 with a top electrode coupled to a second end of the JJ 84.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A superconductor device interconnect structure comprising:
    a first high temperature dielectric layer overlying a substrate;
    a base electrode disposed in the first high temperature dielectric layer, the base electrode having a top surface aligned with the top surface of the first high temperature dielectric layer;
    a second high temperature dielectric layer disposed over the first high temperature dielectric layer and the base electrode;
    a first contact that extends from a top surface of the second high temperature dielectric layer to a first end of the base electrode; and
    a JJ overlying the first contact.

2. The structure of claim 1, wherein the JJ is an aluminum/aluminum oxide/aluminum JJ.

3. The structure of claim 1, wherein the first contact has a diameter that defines the diameter of the JJ.

4. The structure of claim 1, wherein a portion of the first contact forms a bottom portion of the JJ.

5. The structure of claim 1, wherein an oxidized surface of the first contact forms a dielectric portion of the JJ.

6. The structure of claim 1, wherein the JJ is formed from a portion of the first contact that forms a first contact layer of the JJ, and oxidized portion of the first contact that forms a dielectric portion of the JJ and a capped portion that forms a second contact layer of the JJ.

7. The structure of claim 1, wherein the dielectric material employed in the first high temperature dielectric layer and the second high temperature dielectric layer is a material that can form the first and second high temperature dielectric layers at a temperature greater than 180° Celsius.

8. The structure of claim 1, further comprising:
    a second contact that extends from a top surface of the second high temperature dielectric layer to a second end of the base electrode;
    a first conductive line overlying the first contact; and
    a second conductive line overlying the second contact.

9. The structure of claim 8, wherein the second contact, the first conductive line and the second conductive line is formed of niobium and the first contact is formed of aluminum.

10. A superconductor device interconnect structure comprising:
    a first high temperature dielectric layer overlying a substrate;
    a base electrode disposed in the first high temperature dielectric layer, the base electrode having a top surface aligned with the top surface of the first high temperature dielectric layer;
    a second high temperature dielectric layer disposed over the first high temperature dielectric layer and the base electrode;
    a first contact that extends from a top surface of the second high temperature dielectric layer to a first end of the base electrode; and
    a JJ overlying the first contact;
    a second contact that extends from a top surface of the second high temperature dielectric layer to a second end of the base electrode;
    a first conductive line overlying the first contact; and
    a second conductive line overlying the second contact.

11. The structure of claim 10, wherein the JJ is an aluminum/aluminum oxide/aluminum JJ.

12. The structure of claim 10, wherein the first contact has a diameter that defines the diameter of the JJ.

13. The structure of claim 10, wherein a portion of the first contact forms a bottom portion of the JJ.

14. The structure of claim 10, wherein an oxidized surface of the first contact forms a dielectric portion of the JJ.

15. The structure of claim 10, wherein the JJ is formed from a portion of the first contact that forms a first contact layer of the JJ, and oxidized portion of the first contact that forms a dielectric portion of the JJ and a capped portion that forms a second contact layer of the JJ.

16. The structure of claim 10, wherein the dielectric material employed in the first high temperature dielectric layer and the second high temperature dielectric layer is a material that can form the first and second high temperature dielectric layers at a temperature greater than 180° Celsius.

17. The structure of claim 10, wherein the second contact, the first conductive line and the second conductive line is formed of niobium and the first contact is formed of aluminum.

* * * * *